Dec. 10, 1957 R. C. SANDERS, JR 2,816,252

ELECTRONIC MODULE DEVICE

Filed Nov. 12, 1953 2 Sheets-Sheet 1

Royden C. Sanders Jr.
INVENTOR.

BY Edward M. Martin

Dec. 10, 1957 R. C. SANDERS, JR 2,816,252

ELECTRONIC MODULE DEVICE

Filed Nov. 12, 1953 2 Sheets-Sheet 2

Royden C. Sanders Jr.
INVENTOR.

BY [signature]

United States Patent Office 2,816,252

Patented Dec. 10, 1957

2,816,252

ELECTRONIC MODULE DEVICE

Royden C. Sanders, Jr., Nashua, N. H., assignor, by mesne assignments, to Sanders Associates, Inc., Nashua, N. H., a corporation of Delaware Application November 12, 1953, Serial No. 391,617

6 Claims. (Cl. 317—101)

This invention relates to electronic apparatus, its elements and components and to the manufacture and assembly thereof.

The invention is especially useful in mechanized electronic production systems. It is based upon the use of groups of wafer and riser elements in assemblies known as modules.

By so assembling these circuit components into modules an extremely large variety of circuit arrangements is obtainable. The modules effectually become the building blocks of the complete electronic devices. High speed automatic production has become feasible by their use and precise and compact components are made available.

An object of the invention is to provide an improved composite electronic circuit component assembly or module;

A further object of the present invention is to provide an improved module which is especially adapted for manufacture by mass production methods with less tools;

A further object of the invention is to provide an improved module of the type described which is characterized by a high degree of precision, simplicity and compactness.

Other objects of the invention will be apparent from the following description of a typical embodiment thereof, taken in connection with the accompanying drawings.

In conventional practice electronic components such as are used in radio, radar, television, and the like, comprise various elements which are usually mounted on a metallic base, suitably insulated therefrom.

Briefly, the present system produces an improved type of module in which the wafers and supporting, riser elements are given novel configurations and constructions, whereby the module assembly not only may be more speedily and easily fabricated, but the module itself presents a more compact, sturdy and precise unit. This construction is practicable because of the use of special materials, preferably plastic such as phenolic XXXP (which is a thermosetting paper-base phenolic resin laminate—see National Electrical Manufacturer's Association publication entitled, "Standards for Laminated Thermosetting Products), instead of ceramic materials as have been previously emmployed.

As mentioned above, the present system provides an improved module which is composed of a stack of specially shaped wafers, or square-shaped discs of plastic material.

Heretofore wafers of this type have been notched at the edges and the notches in turn have been fused with silver for the purpose of making the desired electrical connections between the various components. In the present improved modules the notches and silver fusing are eliminated and projections or tongues are provided on the edges of the wafers which in turn fit into openings or grooves formed in the supporting side members, riser plates, of the modules. The riser plates are specially constructed to support the wafers as well as to supply electrical contacts in an improved and novel manner.

In order to provide condenser elements on the wafers it has been customary to secure suitably disc-shaped elements to both sides of the wafers. Resistor elements in the form of strips have been similarly applied. A wafer may have one, two, or more elements applied to each of its sides. Tube sockets and coils of metal such as silver, as well as various other elements also are applied to the wafers.

With a group or stack of the novel wafers assembled and inserted into the recessions of the side members, which members as stated provide both conductors for the electrical elements and supporting structure for the wafers, an improved module is provided. A single module may include, for example, as many as twenty wafers, as well as the various connections and one or more tube sockets.

By inserting a group of modules between plastic sheets having printed or photoetched circuits for the element interconnections, a complete module circuit assembly may be provided. The simplicity with which the various units can be assembled lends itself to mass production with high quality.

Figure 4:
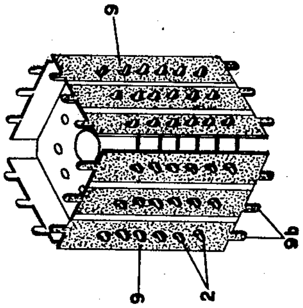
Figure 5:
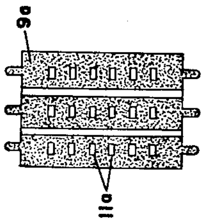
Figure 3:
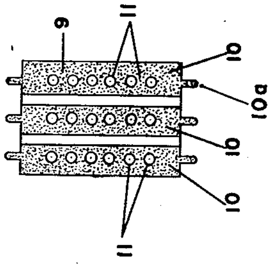
Figure 3A:
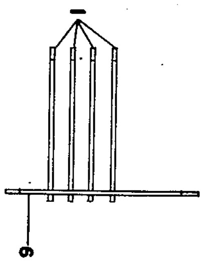
Figure 2:
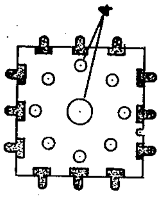
Fig. 2 is a similar view of a wafer element having a tube socket construction.
Figure 2A:
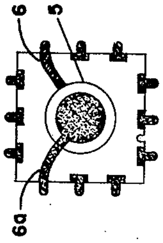
Figure 2B:
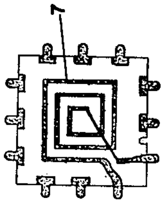
Figure 2C:
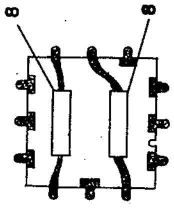
Figure 5A:
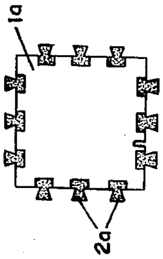
Figures 6, 7, 8:
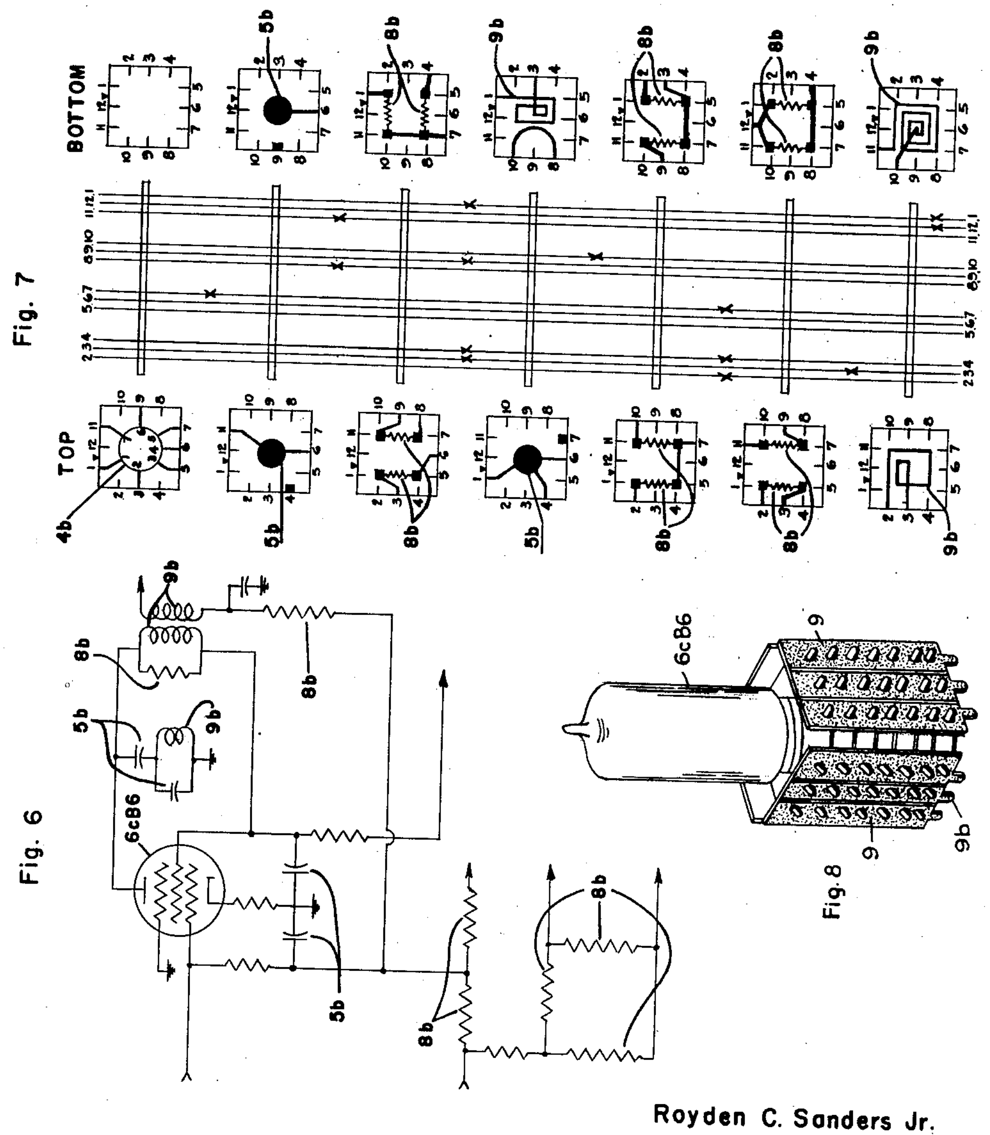

Fig. 2*a* is a similar view of a wafer element having a capacitor element attached to its surface;

Fig. 2*b* is a similar view of a wafer element having an inductance element associated therewith;

Fig. 2*c* is a similar view of a wafer element having a pair of resistors formed on one of its surfaces;

Fig. 3 is a side view of one of the riser supporting members of the improved module;

Fig. 3*a* is a side view illustrating how several wafers are secured to one of the riser members;

Fig. 4 is a perspective view of a completed module with its wafers and riser members assembled;

Fig. 5 is a side view of a modified form of riser member;

Fig. 5*a* is a plan view of a modified form of a wafer adapted to be assembled with the riser member of Fig. 5;

Fig. 6 is a diagram illustrating a circuit, the elements and connection of which are included in the module assembly of Fig. 8;

Fig. 7 is a diagrammatic plan view, showing both sides of a group of wafers such as are used for the circuit illustrated in Fig. 6, with the various connections diagrammatically illustrated; and Fig. 8 is a perspective view of a complete assembled module with a vacuum tube associated therewith, embodying the circuits illustrated in Figs. 6 and 7.

Figure 1:
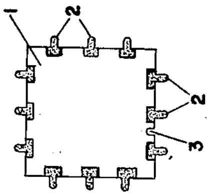
Fig. 1 is a plan view of a plastic wafer element comprised in a module embodying the present invention.

Referring now in more detail to the drawings, a typical wafer element such as is comprised in a module embodying the present invention is illustrated in Fig. 1. It is comprised of suitable plastic material such as XXXP phenolic and is covered with a conductive material such as copper on both of its sides. Silver plate, tin or solder may be used for the conductive coating material when desired. The conductive surfaces are shown cross-hatched in the drawings.

Projection means or members 2, are provided along each of the edges of the wafer elements as shown. Any number or arrangement of projections desired may of course be employed, it being intended as will be presently apparent, that the projections fit into suitable openings or recessions provided therefor in the side elements.

A small indentation may be provided in one edge of the wafers as indicated at 3 for the purpose of mechanically identifying and positioning the wafer elements in mechanical assembly operations, as is known in the art.

The wafers may be readily formed by suitable mass production mechanisms. For example, wafer material may be supplied in large copper clad sheets of phenolic material and then die-stamped or cut into a plurality of wafers of the desired size and shape, for example eight or more, in a single operation.

For the purpose of providing electrical connections in the completed module, the wafers may be prepared by any of the conventional methods used in the art. They may, for example, be etched to remove the undesired material between desired conductive members. That is, the wafer is formed by depositing acid-resisting ink upon the surface of the metal to be preserved and then immersing the wafer in a suitable acid etching bath to remove the surrounding metal. Conversely, the bare phenolic wafer may be used and the desired conductive circuit configuration added.

In Fig. 2 there is shown a wafer which has been formed and fabricated to provide socket elements 4 for a vacuum tube of conventional type. By means of this wafer construction the tube may be directly plugged into the uppermost wafer of the complete module, as will be presently shown.

In Fig. 2*a* there is illustrated a capacitor element or condenser 5 comprising one or more discs of a suitable dielectric characteristic. The condenser 5 is attached directly to the wafer and, as illustrated, the connection 6 being formed by the conductive circuit material and 6*a* by an external connection.

Inductance elements 7 or coils also may be applied directly to a wafer surface, as illustrated in Fig. 2*b*. Resistors 8, in the form of a strip of suitably prepared tape, may similarly be fixed to a wafer surface as shown in Fig. 2*a*.

The wafer elements may be provided with one or two or more electrical elements on either or both of their sides.

Side members 9, as shown in Fig. 3, are formed similarly to the wafer elements as by stamping out sheets of suitable plastic material. In this instance the members 9 are usually coated with the conductive metal on only one side. The unwanted metal is then removed either in the manner described above by etching, or by a suitable mechanical cutting operation, so that conductive riser strips 10 are located on one surface of each of the side members. The members 9 have perforations 11, or recessions, formed therein for holding the projections 2 of the wafers. Projections 9*b* are provided on the end edges of the side members to secure the modules to correspondingly perforated base plates.

As an alternative method of fabricating the side members, elongated strips of the proper size metal riser material may be suitably applied to the surfaces of the side elements.

In Fig. 3*a* there is illustrated a group of four of the wafers assembled in one of the side elements 9.

Using the desired number of wafer elements, for example six in the embodiment illustrated, the four side members are successively secured thereto, with the wafer projections extending into the holes or recessions of the side members. The completely assembled module is shown in Fig. 4. The module surfaces may be successively dipped into a solder bath to secure the connections of the elements on the wafers with the risers.

In Figs. 5 and 5*a* there is illustrated, respectively, a side member 9*a* and a wafer element 1*a* embodying a modification of the previously described arrangement. Here the holes or recessions 11*a* are of oblong shape and the wafers are provided with correspondingly shaped projections 2*a*. It will be noted, however, that the projections are slightly slanted, at their sides, to provide an inverted wedge shape. With this arrangement, by suitably proportioning the parts and by providing material which is sufficiently elastic to permit interfitting of the projections and holes only with a certain amount of force, a very secure fit may be effected between the wafer elements and side members. The necessity for further securing these parts may thereby be eliminated.

In Fig. 6 there is shown a circuit diagram illustrating an arrangement that can be included in a single module assembly such as is shown in Fig. 8. Here a pentode tube 6cB6 has input and output circuits, including various resistor, inductor, and capacitor elements as shown. The several wafer elements employed in the completed module in Fig. 8 are diagrammatically illustrated in Fig. 7 with the connections symbolized, the cutting of the various risers being indicated at X. One side of each of the wafer elements is shown in the left vertical row, with the reverse sides shown at the right directly opposite each corresponding wafer side.

Thus the successive wafer elements from top to bottom, of Fig. 7, illustrate respectively, a tube socket arrangement 4*b*, a capacitor 5*b*, resistors 8*b*, capacitor 5*b*, resistors 8*b*, resistors 8*b*, and an inductance element 9*b*. Similarly, elements are provided on the opposite sides of the wafers in the righthand vertical row.

As stated above the completed assembly is substantially the actual size shown in Fig. 8, including the module with its elements and a vacuum tube mounted thereon. The compact construction here shown actually comprises some nineteen separate electrical elements as well as the circuit connections therefor and tube.

As explained above, by utilizing groups of these module assemblies with printed circuits interconnecting them, complete circuit assemblies of an infinite variety may be readily supplied. The precision, speed and economy of manufacturing and many other advantages of the system are obvious.

What is claimed is:

1. A composite electronic-component module, comprising: a plurality of wafer elements arranged parallel to each other; a plurality of projecting members on each side of said elements, each of said members having a conductive surface; electric circuit elements mounted on said wafer elements; and a plurality of supporting panels, one for each side of said wafer elements, said panels having apertures formed therein into which said projecting members are inserted and having a plurality of conductive paths, said circuit elements being electrically connected to said conductive paths by means of said conductive surfaces.

2. A composite electronic-component module, comprising: a plurality of plastic wafer elements arranged parallel to each other; a plurality of projecting members on each side of said elements, each of said members having a conductive surface; electric circuit elements mounted on opposite sides of said wafer elements; and a plurality of supporting panels, one for each side of said wafer elements, said panels having apertures formed therein into which said projecting members are inserted and having a plurality of conductive paths, said circuit elements being electrically connected to said conductive paths by means of said conductive surfaces.

3. A composite electronic-component module, comprising: a plurality of wafer elements arranged parallel to each other; a plurality of projecting members on each side of said elements, each of said members having a conductive surface; electric circuit elements mounted on said wafer elements; and a plurality of supporting panels, one for each side of said wafer elements, said panels having apertures formed therein into which said projecting members are inserted and having a plurality of parallel conductive paths, said circuit elements being electrically and selectively connected to said conductive paths by means of said conductive surfaces.

4. A composite electronic-component module, comprising: a plurality of wafer elements arranged parallel to each other; a plurality of projecting members on each side of said elements, each of said members having a conductive surface; electric circuit elements mounted on said wafer elements; and a plurality of supporting panels, one for each side of said wafer elements, said panels having apertures smaller in size than said projecting members formed therein into which said projecting members are inserted, said circuit elements being electrically connected to said conductive means by means of said conductive surfaces.

5. A composite electronic-component module, comprising: a plurality of wafer elements arranged parallel to each other; a plurality of wedge-shaped projecting members on each side of said elements, each of said members having a conductive surface; electric circuit elements mounted on said wafer elements; and a plurality of supporting panels, one for each side of said wafer elements, said panels having apertures formed therein into which said projecting members are forcibly inserted and having a plurality of conductive paths, said circuit elements being electrically connected to said conductive paths by means of said conductive surfaces.

6. A composite electronic-component module, comprising: a plurality of plastic wafer elements arranged parallel to each other; a plurality of wedge-shaped projecting members on each side of said elements, each of said members having a conductive surface; electric circuit elements mounted on opposite sides of said wafer elements; and a plurality of supporting panels, one for each side of said wafer elements, said panels having apertures formed therein into which said projecting members are forcibly inserted and having a plurality of parallel conductive paths, said circuit elements being electrically and selectively connected to said conductive paths by means of said conductive surfaces.

References Cited in the file of this patent

UNITED STATES PATENTS

| | | |
|---|---|---|
| 2,226,745 | Schrack | Dec. 31, 1940 |
| 2,424,986 | Hubbell et al. | Aug. 5, 1947 |
| 2,433,384 | McLarn | Dec. 30, 1947 |
| 2,474,988 | Sargrove | July 5, 1949 |

FOREIGN PATENTS

| | | |
|---|---|---|
| 357,171 | Great Britain | Sept. 10, 1931 |
| 654,162 | Great Britain | June 6, 1951 |

OTHER REFERENCES

Electrical Manufacturing, vol. 52, Issue 5; pages 156 to 159. Published November 1953.